United States Patent [19]

Kataoka et al.

[11] Patent Number: 4,515,024
[45] Date of Patent: May 7, 1985

[54] CLUTCH MECHANISM OF A PUSH-BUTTON TUNER

[75] Inventors: Takeshi Kataoka; Ryoichi Aoki; Hisashi Matsui; Hiroshi Matsumoto, all of Ueda, Japan

[73] Assignee: Ono Seiko Co., Ltd., Tokyo, Japan

[21] Appl. No.: 379,987

[22] Filed: May 19, 1982

[30] Foreign Application Priority Data

May 19, 1981 [JP] Japan .................................. 56-74295
May 19, 1981 [JP] Japan ............................ 56-71370[U]

[51] Int. Cl.³ .............................................. H03J 5/12
[52] U.S. Cl. .................................. 74/10.33; 74/10.85; 74/380; 74/425; 334/7
[58] Field of Search .................... 74/10.33, 10.85, 380, 74/425; 334/7

[56] References Cited

U.S. PATENT DOCUMENTS

| 2,477,995 | 4/1945 | Marholz | 74/10.33 |
| 3,022,674 | 2/1962 | Cross et al. | 74/10.85 |
| 4,062,243 | 12/1977 | Clark | 334/7 |
| 4,152,682 | 5/1979 | Ito et al. | 74/10.85 |
| 4,187,729 | 2/1980 | Kanai et al. | 74/10.33 |
| 4,204,179 | 5/1980 | Kataoka et al. | 74/10.33 |
| 4,231,263 | 11/1980 | Antonello | 74/10.33 |
| 4,326,429 | 4/1982 | Mortensen | 74/6 |

FOREIGN PATENT DOCUMENTS 52-37701 3/1977 Japan .

Primary Examiner—Allan D. Herrmann
Attorney, Agent, or Firm—Wenderoth, Lind & Ponack

[57] ABSTRACT

Clutch means for changing inductance of a push-button tuner which is compact in size and adapted for use with a tape recorder. The mechanism includes flat slidable cam plates provided with cam portions at the front portions thereof, which are arranged horizontally and slidably through holes of side walls and a push-button assembly slidably arranged in front and rear walls, which is equipped with a channeling plate pivotably mounted thereon, the position of which may be set at a desired angle by means of the operation of a manual shaft when a clutch mechanism is engaged. With the advancement of the push-button assembly, a head thereof touches the cam of the clutch plate arranged in parallel with the slidable cam plate at the front of the push-button assembly whereby the clutch plate is forced to be shifted horizontally against a coil spring the biasing force of which acts on a follower manual shaft supported in an arm hole of the clutch plate which is partially released whereby the clutch mechanism is disengaged by ending the engagement of a rotation means with a gear wheel with which a worm gear mounted on the follower manual shaft is in meshing engagement.

4 Claims, 12 Drawing Figures

CLUTCH MECHANISM OF A PUSH-BUTTON TUNER

BACKGROUND AND BRIEF SUMMARY OF THE INVENTION

The present invention relates to a clutch mechanism of a push-button tuner which is compact and flat so as to be adapted for a tape recorder, and more specifically relates to a clutch mechanism having a simple structure and a smooth operations.

Recent market conditions indicate that there may be a considerably big demand for tape recorders provided with a push-button tuner. Naturally, various types of mechanisms designed to meet the demand are now being searched for, which requires a type of tuner having an optimum physical thinness to be compatible with the tape recorders.

The U.S. Pat. No. 4,204,179 describes a push-button tuner which is compact and flat in size designed to be adapted for a tape recorder.

The tuner includes flat slidable cam plates provided with cam portions at the front thereof, which are arranged horizontally and slidably through holes of side walls and a push-button assembly slidably arranged in front and rear walls thereof. The tuner is equipped with a channeling plate pivotable thereon the position of which may be set at a desired angle by means of the operation of a manual shaft when the clutch mechanism is engaged. The clutch mechanism which is operable by the manual shaft comprises various elements such as a clutch lever support, a gear wheel, a disc, a collar, a rotation means and a lever plate etc. With the advancement of the push-button plate against a coil spring arranged at the end thereof, the projections positioned on the channeling plated set at a desired angle collide with the cam portions of the slidable cam plates intermittently whereby the slidable cam plates are shifted transversely and the intermittent shifting movements of the cam plates thus created are transmitted to the foot of a core carriage by turns through a rotation means connected therewith with the result that the cores mounted on the carriage are shiftable back and forth with respect to the coil bodies whereby the variation of inductance is obtained.

The conventional tuner heretofore described has so far succeeded to achieve the object as far as thinness and size thereof is concerned. However, the tuner has complexities in its structure. Especially the clutch mechanism is composed of so many elements as herefore explained. Therefore, the production thereof requires many complicated steps with resultant increase of production costs.

It is an object of this invention to provide a clutch mechanism having a simple structure by reducing the number of component elements and production costs to a minimum.

Another object of this invention is to provide a simple clutch mechanism equipped with a gear wheel and a rotatable means which performs a smooth and accurate clutching or declutching operation of a push-button tuner.

Other and further objects, features and advantages of the invention will appear more fully from the following descriptions.

A brief description of a clutch arrangement of the present invention will be given hereunder.

When a clutch mechanism is in an engaged state, with the rotation of a main manual shaft, the movement is transmitted through a pair of gears to a follower manual shaft having a worm gear mounted thereon with which a gear wheel within which a rotation means is positioned is meshing whereby the follower manual shaft and the gear wheel rotates accordingly, together with the rotation means. A pair of feet of the rotating means slidably positioned in two sliding cam plates horizontally and slidably supported by a tuner frame shift transversely bringing forth an alternating shifting of the two sliding cam plates. Simultaneously, an arm of said rotation means connected to a core carriage by means of a coil spring causes back or forth movement thereof whereby cores mounted on the core carriage are shifted with respect to coil bodies with the result that the desired variation of inductance is obtained.

The worm gear mounted on the follower manual shaft which is meshing with the gear wheel regardless of the clutch mechanism being engaged or disengaged can be moved away from the gear wheel by a clutch plate shifted by the forward pushing of push-button plate whereby the engagement of the gear wheel with the rotation means is released while the meshing between the worm gear and the gear wheel is still maintained with the result that the disengaged state of the clutch mechanism may be maintained.

DETAILED DESCRIPTION OF THE INVENTION

The clutch mechanism of a push-button tuner of this invention will be described hereinafter with specific reference to the drawings.

Figure 1:
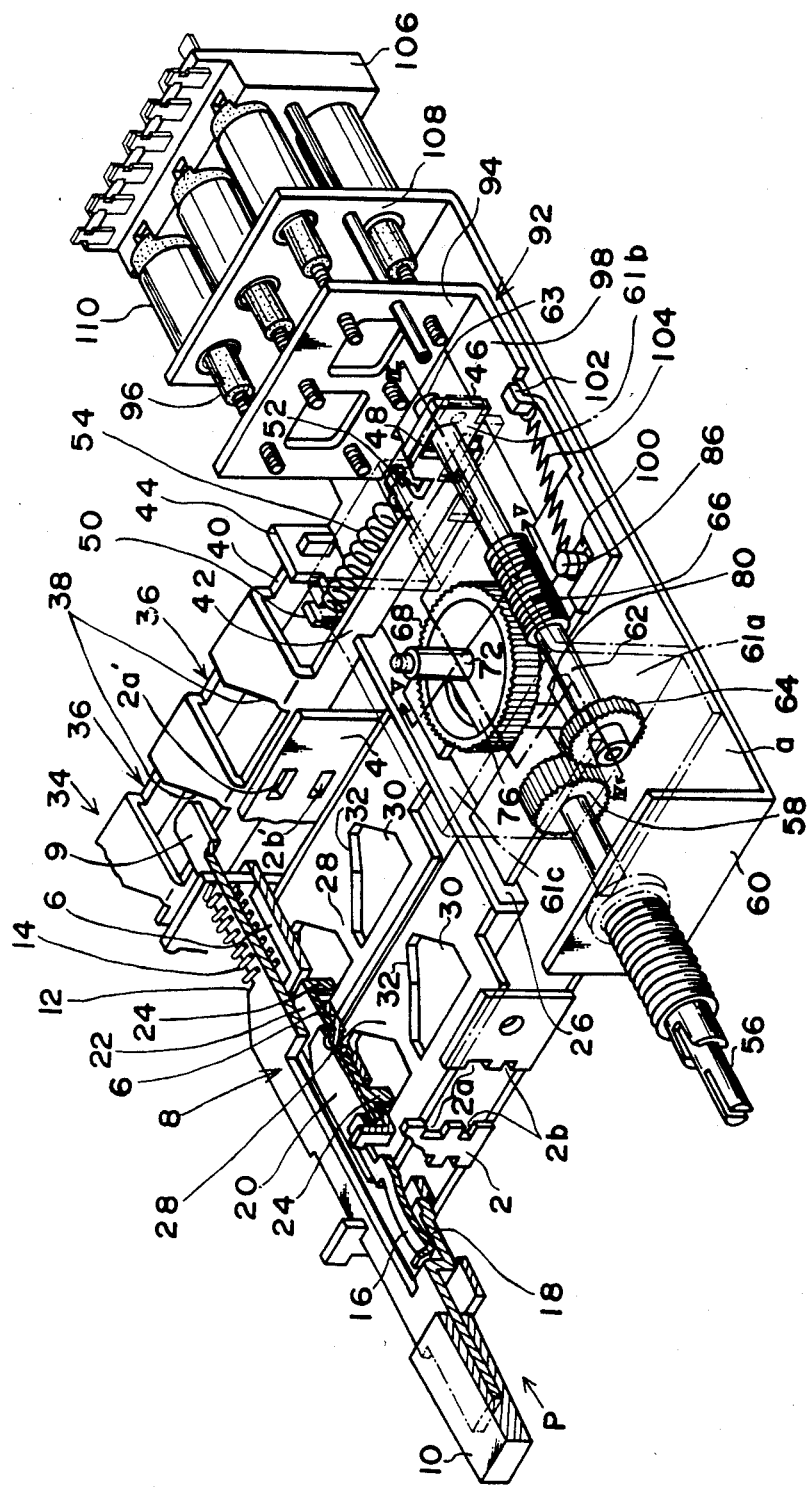
FIG. 1 is a perspective view of a tuner including a clutch mechanism according to this invention with a holding cover being shown by phantom lines.

Referring to FIG. 1, a push-button assembly P comprises a push-button 10, a push-button plate 8, a sliding metal plate 16, a retaining plate 20, a channeling plate 22, a flat base plate 6 and coil spring 14, the details of which will be set forth hereinafter. A front wall 2 and a rear wall 4 are mounted in parallel on a horizontal flat frame a, while a side wall 26 and another side wall, not shown are also arranged in parallel at a right angle to the front and rear walls 2 and 4. The push-button plate 8 one end of which is fixedly inserted in the push-button 10 is positioned, in parallel with the flat base plate 6, horizontally and slidably through slits 2a, 2b and holes 2a', 2b' disposed in the front wall 2 and the rear wall 4, respectively. The coil spring 14 is received on the push-button plate 8 between the rear wall 4 and a stepped edge 12 of the push-button plate 8 and urges the push-button plate 8 back to its initial position by its biasing force whenever the forward depression force on the push-button 10 is released.

The sliding metal plate 16 has an L-shaped front end which moves forward or backward slidably in the lengthwise direction of the push-button plate 8 with its back edge resting on the retaining plate 20.

The channeling plate 22 has a pair of projections 24 depending therefrom and is pivotably positioned on the flat base plate 6, whereby the channeling plate 22 is held rotatably on the flat base plate 6. The retaining plate 20 which may be a resilient leaf spring extends lengthwise to rest on the surface of the channeling plate 22. Whenever the push-button plate 8 is pushed forward together with the flat base plate 6 by the depression of the push-button 10, an L-shaped portion 18 of the push-button plate 8 located underneath the L-shaped front end of the sliding metal plate 16, pushes the front end of the sliding metal plate 16 upwardly and the other end thereof downwardly onto the retaining plate 20 whereby the channeling plate 22 is unmovably retained by the retaining plate 20 at a desired position on the surface of the flat base plate 6.

Figure 2:
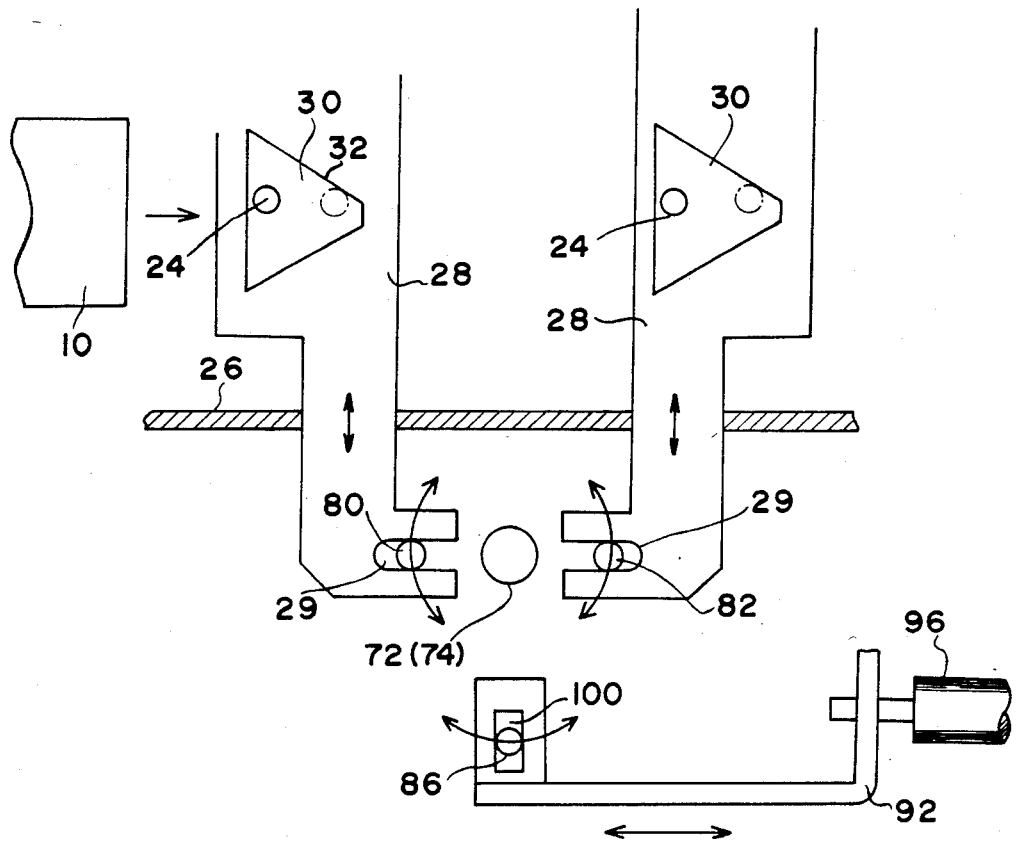
FIG. 2 is a schematic view illustrating the movement of a sliding cam plate, a rotation means and a core carriage.
Figure 3:
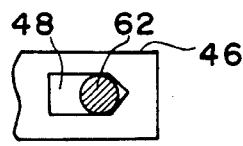
FIG. 3 is a side view of a part of the clutch plate holding a follower manual shaft.

Sliding cam plates 28 are horizontally and slidably supported by vertical side wall 26 and the other wall not visible. Thes sliding cam plates 28 are provided at their front portions of holes 30 defined therein with a plurality of cams 32 respectively, corresponding to the push-button assemblies P in numbers and in positions. Portions of sliding cam plate 28 which are protruding outside the vertical side walls are provided with slits 29 as is shown in FIG. 2.

A clutch plate 34 positioned at the back of the rear wall 4 in parallel with the sliding cams 28 and is slidably mounted for movement at a right angle to the side wall 26. The clutch plate 34 is provided with cams 38 at the front portion of cutaway holes 36 having disposed therein a head 9 of push-button plate 8 which are slidable on the cam 38 when the forward shifting of the push-button assembly P is performed. The clutch plate 34 also has a pair of arms 40 and 42 which are extending in the direction of a core carriage 92 which will be described in detail hereinafter. A short arm 40 is slidably positioned in a vertical wall 44 located at the end of side wall 26, while a hand 46 at the end of the long arm 42 is provided with a hole 48 through which a follower manual shaft 62 is rotatably positioned.

Extending between a projection 52 disposed on the long arm 42 and a projection 50 on the side wall 26 there is a coil spring 54 which urges the clutch plate 34 toward the left as seen in FIG. 1, whereby the hand 46 is pulled to touch the follower manual shaft 62 positioned through the hole 48.

In parallel with and in front of the hand 46, there is a holder wall 61b provided with a hole 49 through which the edge of follower manual shaft 62 is also rotatably held. The size of holes 48 and 49 disposed in the hand 46 and the holder wall 61b respectively is so defined as to maintain a continuous meshing of a gear wheel 68 with a worm gear 66 mounted on the follower manual shaft 62 regardless of an engagement or disengagement of the gear wheel 68 with a rotation means 70 as will be explained hereinafter.

A main manual shaft 56 having a gear wheel 58 fitted at the end thereof is horizontally and rotatably arranged in the vertical wall 60 of a frame a and in a vertical holder wall 61a. The gear wheel 58 is in meshing engagement with a gear wheel 64 positioned at the end of the follower manual shaft 62 which is arranged rotatably and horizontally in parallel with the main manual shaft 56 supported by the holder wall 61a and the hand 46 of the clutch plate 34.

Figure 4:
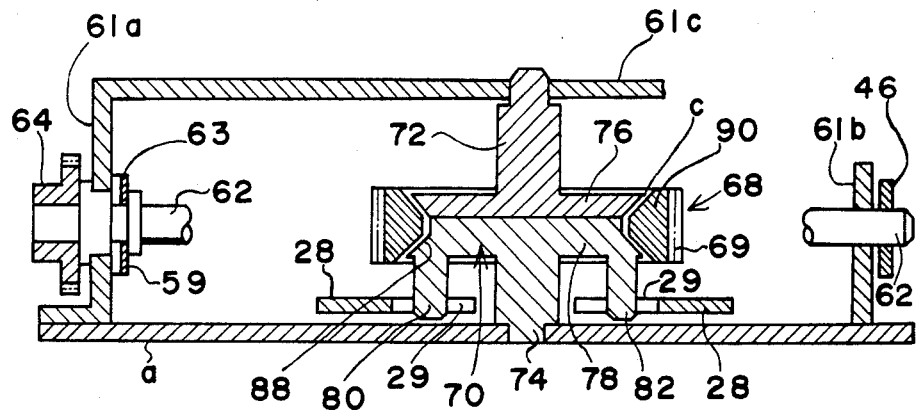
FIG. 4 is a sectional view taken along line IV—IV of FIG. 1.

A leaf spring 59 is positioned between the holder wall 61a and the collar 63 mounted on the follower manual shaft 62, as shown in FIG. 4, whereby the follower manual shaft is urged toward the hand 46.

Figure 5:
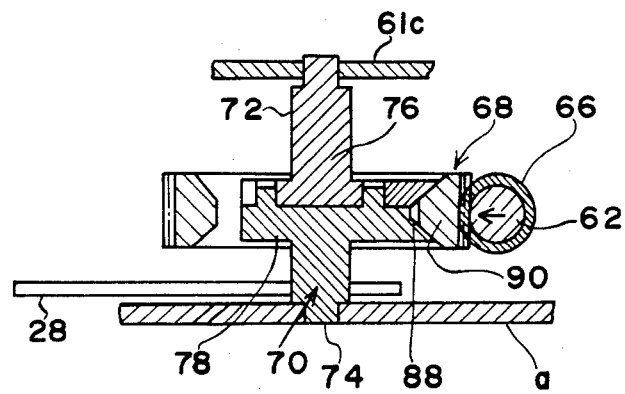
FIG. 5 is a sectional view taken along line V—V of FIG. 1.
Figure 6:
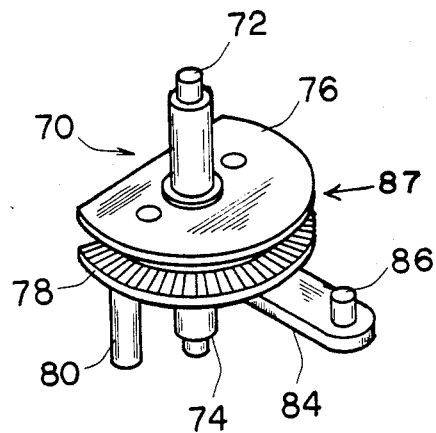
FIG. 6 is a perspective view of a rotation means.
Figure 7:
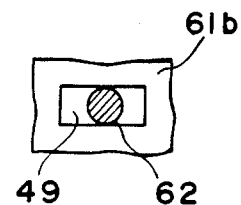
FIG. 7 is a side view of a follower manual shaft held in a hole of holder wall.

The worm gear 66 mounted on the follower manual shaft 62 is in meshing engagement with teeth 69 of a gear wheel 68 within which the rotation means 70 is positioned. The rotation means 70 shown in FIGS. 4–6 comprises a head 87 having arc shaped upper and lower portions 76 and 78, depending feet 80 and 82 and an extending arm 84 on which a projection 86 is disposed.

A V-shaped annular hollow 88 is defined in the periphery of head 87 by the upper and lower portions 76 and 78 constituting elements of the rotation means 70 and a V-shaped annular projection 90 disposed on the inside surface of the gear wheel 68 is fitted into hollow 88, leaving a small clearance C therebetween whenever the clutch mechanism is declutched. The head 87 of the rotation means 70 comprises an upper shaft 72 protruding from the upper portion 76 and a lower shaft 74, depending from the lower portion 78 both portions being unitarily and coaxially fitted as shown in FIG. 4. However, they may be made of a single plastic material without the upper and the lower portions being separately molded. The upper shaft 72 and the lower shaft 74 are rotatably fitted in a holder cover 61c and the frame a respectively. The pair of depending feet 80 and 82 and the arm 84 on the lower portion 78 are at the apexes of a triangle. The feet 80 and 82 are perpendicularly and rotatably engaged in slits 29 arranged in the edges of sliding cam plates 28. The projection 86 disposed on the surface of the arm 84 is slidably fitted into a slit 100 arranged at an edge of a horizontal arm 98 extended from a vertical wall 94 of the core carriage 92 which is shiftable back and forth on the surface of the frame a.

A coil spring 104 between the projection 86 disposed on the arm 84 of the rotation means 70 and the projection 102 disposed on the horizontal arm 98, urges the arm 84 of the rotation means 70 toward the vertical wall 94 of the core carriage 92. Several cores 96 held by the vertical wall 94 and a vertical wall 108 of the frame a are slidable in unison with the movement of the core carriage 92, in and out of coil bodies 110 arranged on the vertical wall 108 and a coil body stand 106. In this embodiment, a V-shaped annular groove and a V-shaped annular projection are provided as explained above. However, it is not necessary to stick to the above shapes. As long as the engagement or disengagement of the gear wheel 68 with the rotation means 70 is performed efficiently, various shapes may be adopted.

The operation of the mechanism for changing inductance according to this invention will be explained hereunder.

Whenever the coil spring 54 urges the clutch plate 34 toward the left in FIG. 1, the clutch mechanism is in the engaged state. Consequently, the hand 46 of the clutch plate is being pressed against the follower manual shaft 62 the worm gear 66 of which is meshing with the gear wheel 68 which is in turn pushed to the gear wheel 68. Naturally, the V-shaped annular projection 90 which is disposed within the gear wheel 68 is firmly engaged with the V-shaped annular groove 88 disposed in the periphery of the head 87 of the rotation means 70 such that both elements, the rotation means 70 and the gear wheel 68, will rotate in unison whenever the rotation of the main manual shaft 56 is transmitted to the follower manual shaft 62 through gears 58 and 64 and causes the driving of the gear wheel 68 by means of the worm gear 66 mounted on the follower manual shaft 62.

Consequently, the rotation means 70 rotates with the upper shaft 72 and the lower shaft coaxially whereby the sliding cam plates 28 slidably supported by side walls shift in opposite directions to each other corresponding to the movement of depending feet 80 and 82 engaging with slits 29 disposed in the sliding cam plates 28.

Simultaneously, the movement of the arm 84 of the rotation means 70 is transmitted to the core carriage 92 through the projection 86 arranged on the arm 84 which is movably engaged with the hole 100 arranged in the sliding arm 98 whereby the core carriage 92 shifts back and forth by means of the coil spring 104 with the result that the cores 96 go into or out of the coil bodies.

As heretofore explained, when the clutch mechanism is in engaged state, the rotation of the main manual shaft 56 through the follower manual shaft 62 imparts the movement to the clutching members such as the gear wheel 68, the rotation means 70 etc. whereby the position of the sliding cam plates 28 and the core carriage 92 can be set at a desired position. As soon as the positions of the sliding cam plates 28 are set as heretofore explained, each push-button assembly P is pulled out in the backward direction and the L-shaped edge of the sliding metal plate 16 is disengaged from the stepped portion 18 of the push-button plate 8 whereby the retaining force of the sliding metal plate 16 on the channeling plate 22 through the retaining plate 20 is released and the channeling plate 22 becomes rotatably free. With the advancement of a push-button assembly P against the coil spring 14 the projection 24 will touch the corresponding slidable cam plate 28 and with further advancement of the push-button plate 8, the stepped portion 18 thereof slides underneath the L-shaped portion of the sliding plate 16 whereby the other end of the retaining plate 20 in turn retains the channeling plate 22 at the desired rotational position on the push-button base plate 6, whereat the projections 24 are set by colliding with the cams 32 of the sliding cam plate 28 respectively the positions of which have already been determined, as was heretofore explained. Thus the positioning of the channeling plate 22 at a desired position may be obtained with accuracy and ease.

The declutching operation may be performed in the following manner.

When the push-button plate 8 is advanced forward by the depression of the push-button 10 against the coil spring 14, the head 9 thereof contacts slidably on the cam portion 38 of the clutch plate 34, whereby the clutch plate 34 is forced to be shifted to the right as seen in FIG. 1. against the coil spring 54. Simultaneously, the hand 46 of the clutch plate 34 is shifted in the same direction therewith. The biasing force of the coil spring 54 working on the rotation means 70 and the gear wheel 68 by the medium of the hand 46, the follower manual shaft 62 and the worm gear 66 mounted thereon is released and naturally the pressing force of the gear wheel 68 on the rotation means 70 is released with the result that a clearance c is formed between the V-shaped annular projection 90 of the gear wheel 68 and the V-shaped annular groove 88 disposed in the periphery of head 87 as shown in FIG. 4.

However, it should be noted that the meshing engagement of the worm gear 66 with the gear wheel 68 is kept regardless of the declutched state. Consequently, upon the rotation of main manual shaft 56, the gear wheel 68 can be rotated by the medium of the follower manual shaft 62 equipped with the worm gear 66. But the shifting of cores 96 with respect to coil bodies 110 will not be effected, because the rotation means 70 connected to the core carriage 92 does not function in unison with the gear wheel 68.

And as a push-button assembly P is advanced, either of the projections 24 of the channeling plate 22 already set at a rotational position touches the corresponding one of the cams 32 of the sliding cam plates 28 whereby the corresponding one of the sliding cam plates 28 is shifted as heretofore explained with the result that the advancement of the push-button plate 8 is suspended.

As explained above, whenever the clutch mechanism is declutched, the pressing force of the gear wheel 68 onto the rotation means 70 is released, whereby the shifting operation of the sliding cam plate 28 becomes easy by an external force applied i.e. the movement of cores 96 with respect to the coil bodies 110 is performed with ease through the rotation means 70. With the further advancement of push-button assembly P the channeling plate 22 is also advanced as to allow the both projections 24 thereof to collide with the corresponding cam 32 whereby the position of both sliding cam plates 28 are set by shifting corresponding to the position of the channeling plate 22 and the shifting of core 96 with respect to the coil body 110 is easily attained through the rotation means 70. The inductance is thus changed by reproducing the rotation angle of the channeling plate 22.

Subsequently, as the depression of the push-button assembly P is released, it returns to its initial position due to the biasing force of the coil spring 14 and the clutch plate 34, the sliding cam plates 28 are also returned to their initial positions. The biasing force of coil spring 54 acts again on the rotation means 70 through the elements as heretofore explained with the result that the gear wheel 68 pressed onto the rotation means 70 disposed thereinside as heretofore explained. Thus, the clutch mechanism is in the clutch state, with the correct position of core 96 with respect to coil body 110 being maintained.

Figure 8:
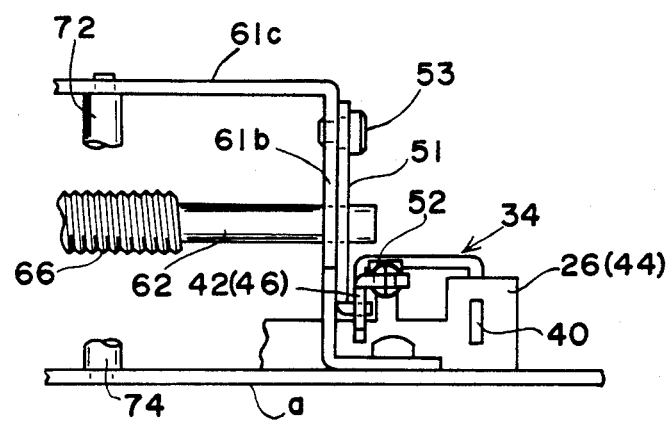
FIG. 8 is a side view of another embodiment of a follower manual shaft held by a lever means.
Figure 9:
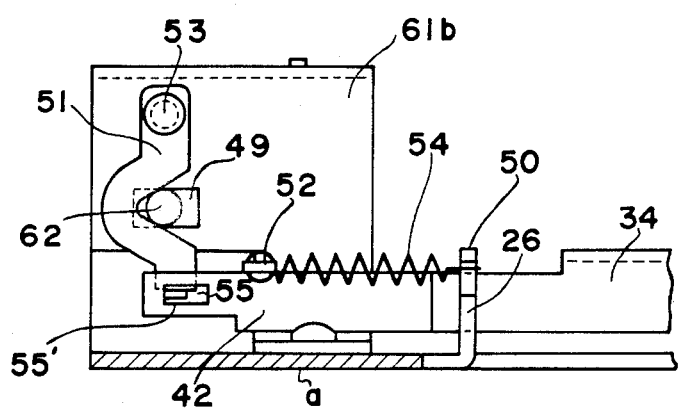
FIG. 9 is another view of the embodiment of FIG. 8 seen from a different direction.

FIGS. 8 and 9 illustrate another embodiment of a follower manual shaft 62 supported by a holder wall 61b. A V-shaped lever 51 one end of which indicated by numeral 53 is pivotably supported in the holder wall 61b while the other end 55' is movably held in a hole 55 in the end of the clutch plate arm 42. The bottom of V-shaped lever 51 is pressed onto the follower manual shaft 62 supported in the hole 49 disposed in the holder wall 61b by means of biasing force of the coil spring 54 spanning the two projection 50 and 52. The structure ensures an easy and smooth shifting of the lever 51 toward or away from the follower manual shaft 62 whereby an accurate setting of the shaft 62 in relation to the coil spring 54 may be successfuly obtained.

Figure 10:
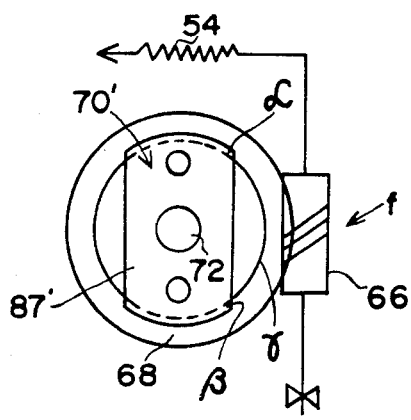
FIG. 10 is a plan view illustrating another embodiment of a rotation means fitted within a gear wheel.
Figure 11:
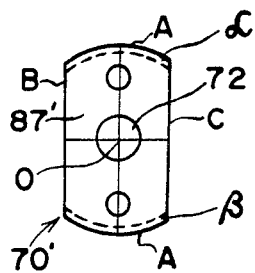
FIG. 11 is a plan view of the rotation means of the embodiment of FIG. 10.

Another embodiment of a rotation means is illustrated in FIGS. 10 and 11. A head 87′ of the rotation means 70′ is in the form of a diametrically extending arm provided with a pair of arc portions A at the ends and having vertical flat walls B and C respectively, and in the peripheries of the ends are formed V-shaped grooves similar to grooves 88 of FIGS. 4–6. In the first embodiment as shown schematically in FIG. 12, the head 87 of the rotation means 70 is provided with only one arc portion in the periphery of which the V-shaped annular groove 88 is formed.

Whenever the pressing force f acts on the gear wheel 68 by means of the biasing force of coil spring 54, as shown in FIG. 10 the gear wheel 68 and the rotation means 70′ are tightly engaged with each other as heretofore explained, with main contacting points created therebetween by the force f at points shown by letters $\alpha$ and $\beta$.

Figure 12:
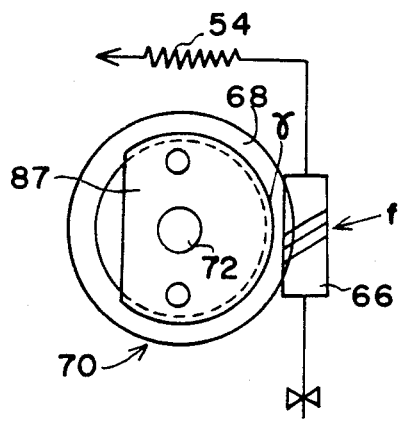
FIG. 12 is a plan view of the rotation means of FIGS. 4-6 fitted in a gear wheel.

In the embodiment shown in FIG. 12, there is only one main contacting point $\gamma$ created by the tight engagement of the gear wheel 68 with the rotation means 70. In both cases as illustrated in FIGS. 10 and 12, the engagement or disengagement of the V groove 88 with the V projection 90 may be performed with smoothness and accuracy.

The tuner provided with the clutch mechanism of this invention is simple in structure and compact in size and is so devised as to perform an accurate and easy clutching and declutching operation which permits a correct setting of the channeling plate at a desired position. The correct maintenance of the core at any selected position with respect to coil bodies is also ensured and the correct variation of inductance can be attained.

While a couple of embodiments of the invention are herein disclosed, it will be appreciated that many variations may be made in details thereof without departing from the spirit and scope of the invention as defined in the following claims.

We claim:

1. In a push-button tuner for use with a tape recorder and which has flat cam plates provided with cam portions in holes therein and which are horizontally slidable through holes in side walls of the tuner, and a push button assembly slidably arranged between front and rear walls and which has a channeling plate pivotably mounted thereon, a clutch mechanism having a clutch plate having a cam therein and slidable lengthwise parallel with the cam plates against the action of a coil spring by the action of the push-button assembly on the cam, a main manual shaft and a follower shaft connected for rotation together, the end of the main manual shaft being rotatably held in the end of the clutch plate for lateral movement, a worm gear on said main manual shaft, and a core support plate slidable for moving cores into and out of coils in accordance with the movement of the core supporting plate; an improved gear wheel clutch and transmission means connected between said cam plates, said worm wheel and said core support plate and comprising: an annular gear wheel having an annular projection projecting radially into the center of said annular gear wheel; a rotation head positioned within said annular gear wheel and mounted on said tuner for rotation within said annular gear wheel and having a laterally outwardly opening groove therearound substantially complementary in shape to said annnular projection, said head having a diameter for having the surfaces defining said groove spaced slightly from the surfaces defining said projection when said head is centered in said annular gear wheel, said annular gear wheel being in mesh with said worm gear and being movable laterally of said head upon lateral movement of said main manual shaft for bringing said projection into frictional driving engagement with said groove; a pair of feet projecting from the lower side of said head and engaged with said cam plates for transmitting movement between said cam plates and said head; and an arm projecting laterally from said head and connected to said core support plate for moving said core support plate in response to movement of said head.

2. An improved gear wheel and clutch transmission means as claimed in claim 1 in which said annular projection is substantially triangular in cross-section and said groove is substantially V-shape.

3. An improved gear wheel and clutch transmission means as claimed in claim 1 in which said head is substantially segment-shaped with the middle of the circumference of the curved part of the segment substantially opposite said worm gear.

4. An improved gear wheel and clutch transmission means as claimed in claim 1 in which said head is a diametrically extending arm having arc portions at the end thereof in which said groove is located, and said arm extends generally parallel to said main manual shaft.

* * * * *